United States Patent [19]

Tsuji

[11] Patent Number: 4,748,538
[45] Date of Patent: May 31, 1988

[54] SEMICONDUCTOR MODULE
[75] Inventor: Mutsuo Tsuji, Tokyo, Japan
[73] Assignee: NEC Corporation, Tokyo, Japan
[21] Appl. No.: 881,656
[22] Filed: Jul. 3, 1986
[30] Foreign Application Priority Data Jul. 8, 1985 [JP] Japan ................................ 60-148217
Jul. 8, 1985 [JP] Japan ................................ 60-148219

[51] Int. Cl.$^4$ .............................................. H05K 7/20
[52] U.S. Cl. .................................. 361/386; 165/80.3;
165/185; 174/16 HS; 357/81
[58] Field of Search ............................ 165/80.3, 185;
174/16 HS, 52 FP; 357/81; 361/386–389, 405

[56] References Cited

FOREIGN PATENT DOCUMENTS 0153457 9/1982 Japan ..................................... 357/81
0219942 12/1984 Japan ..................................... 357/81

OTHER PUBLICATIONS

Balderes et al., "Universal Air-Cooled Module", IBM Technical Disclosure Bulletin, vol. 21, No. 11, 4/79, p. 4476.
Betz, "Circuit Module Thermal Conduction", IBM Technical Disclosure Bulletin, vol. 12, No. 8, 1/70, p. 1277.
35th Electronic Components Conference Proceedings 1985, pp. 180–186, 192–198, ISSN 0569-5503.

Primary Examiner—A. D. Pellinen
Assistant Examiner—Gregory D. Thompson
Attorney, Agent, or Firm—Burns, Doane, Swecker & Mathis

[57] ABSTRACT

A semiconductor module includes a multi-layer wiring substrate provided at a first surface with a plurality of input/output terminals and at a second surface with lead terminals connected to the input/output terminals. A cap is provided above the multi-layer wiring substrate by means of leg members which forms a space between the cap and the multi-layer wiring substrate. A semiconductor chip is fixed to the side exposed to the space of the cap, and lead wires are provided, each having one end attached to a terminal of the semiconductor chip. The lead wires are drawn out in advance so that they can be visually confirmed from an upper direction of the cap and have their other ends connected to the lead terminals.

9 Claims, 2 Drawing Sheets

SEMICONDUCTOR MODULE

BACKGROUND OF THE INVENTION

The present invention relates to a semiconductor module, and more particularly to a semiconductor module in which semiconductor chips are mounted on a multi-layer wiring substrate.

Semiconductor modules of various structure in which semiconductor chips are mounted on a multi-layer wiring substrate have been developed. For instance, a multi-chip module having an improved thermal performance is described by Kohara et al. in a paper entitled "High-Thermal Conductive Module" in 35TH Electronic Components Conference, Proceedings 1985, pp 180–186.

In addition, a new packaging technology of LSI chip is described by Watari et al. in a paper entitled "Packaging Technology For The NEC SX Supercomputer" in the above-mentioned 35TH Electronic Components Conference, Proceedings 1985, pp 192–198.

Conventional semiconductor modules have adopted structure in which a face down semiconductor chip is fixed on a semiconductor substrate and then a cap is provided to cover the fixed semiconductor chip by adhering a die of the semiconductor chip to a surface of the cap opposite the substrate. When such a structure is employed, since the adhering or bonded portions cannot be visually confirmed or recognized, high precision technique is required for assembling work. In addition, since the number of individual bonded portions is also increased, the number of assembling steps is increased, resulting in lowered reliability of the module itself.

SUMMARY OF THE INVENTION

An object of the present invention is to eliminate the above-mentioned drawbacks with the prior arts to provide a semiconductor module of a structure which can easily perform assembling work and connecting operation required therefor in a simplified manner.

A semiconductor module according to the present invention comprises a multi-layer wiring substrate provided at a first surface with a plurality of input and output terminals and at a second surface thereof with lead terminals connected to the input and output terminals. A rectangular cap and leg members are provided on the second surface of the multi-layer wiring substrate, the leg members being fixed to four corners of the rectangular cap to form between the multi-layer wiring substrate and the cap a space communicating with open air. A semiconductor chip is fixed to a surface of the square cap which is exposed to the space and is supported by the square cap. Lead wires are provided each having one end connected to a terminal of the semiconductor chip. The lead wires extend outwardly from the semiconductor chip so that they can be visually confirmed from above the cap, and are bent to permit the other ends of the lead wires to be connected to the lead terminals.

DETAILED DESCRIPTION OF PREFERRED EMBODIMENT

An embodiment of a semiconductor module according to the present invention will be described in detail with reference to the attached drawing.

Figure 1:
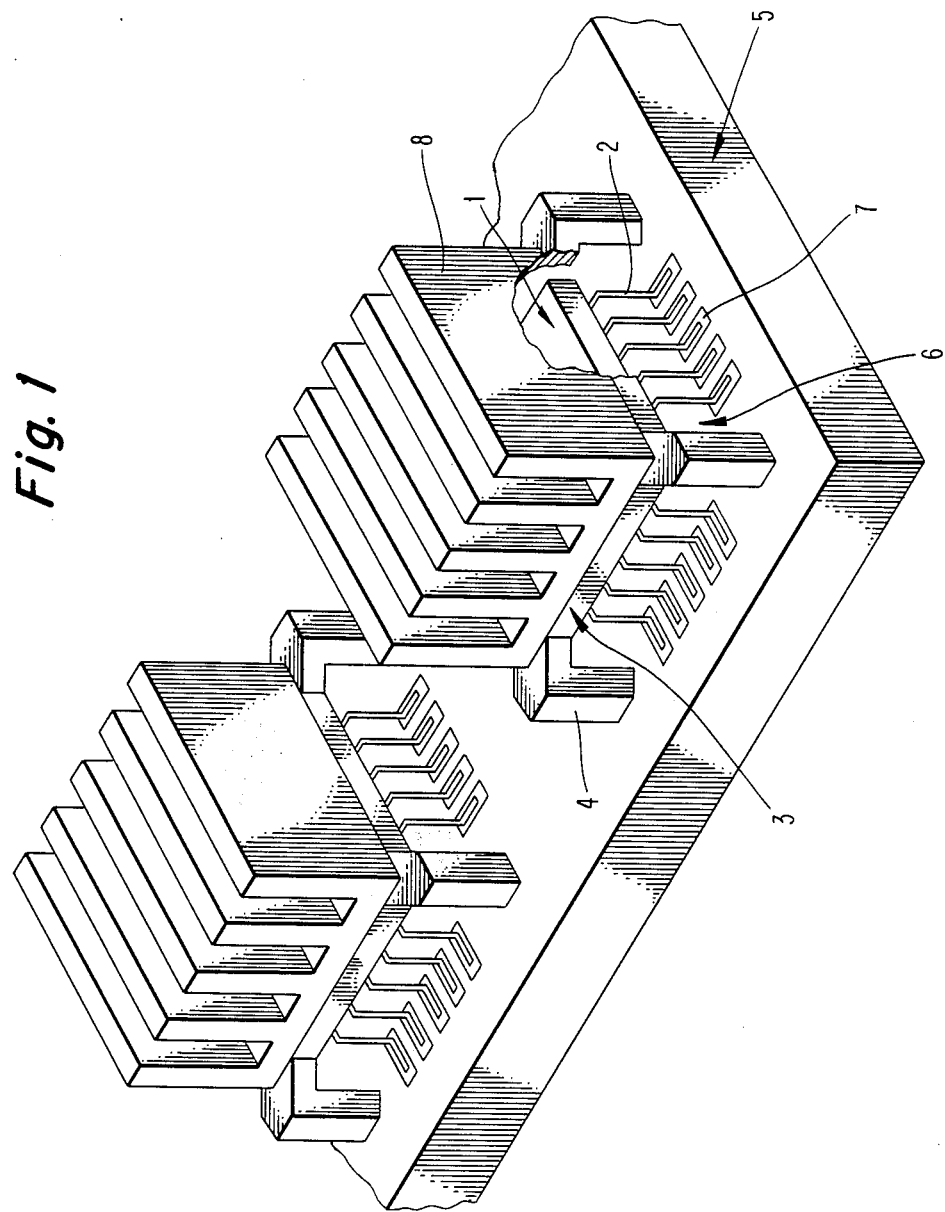
FIG. 1 is a perspective view, partly cut away, of a semiconductor module in accordance with the present invention.
Figure 2:
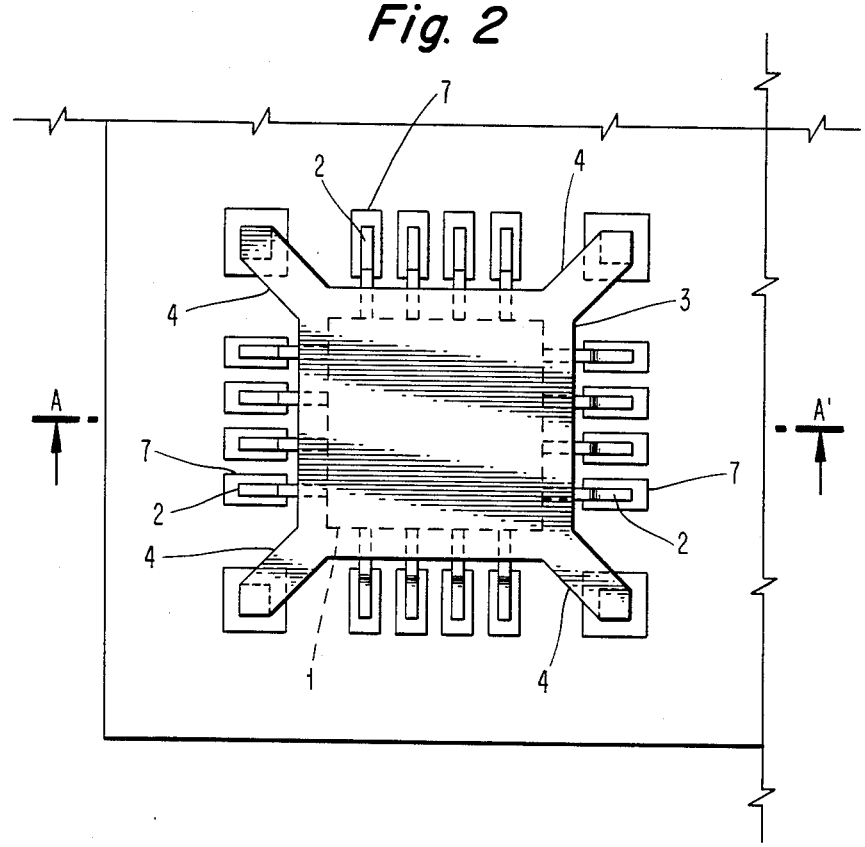
FIG. 2 is a plan view of a semiconductor module in accordance with the present invention.
Figure 3:
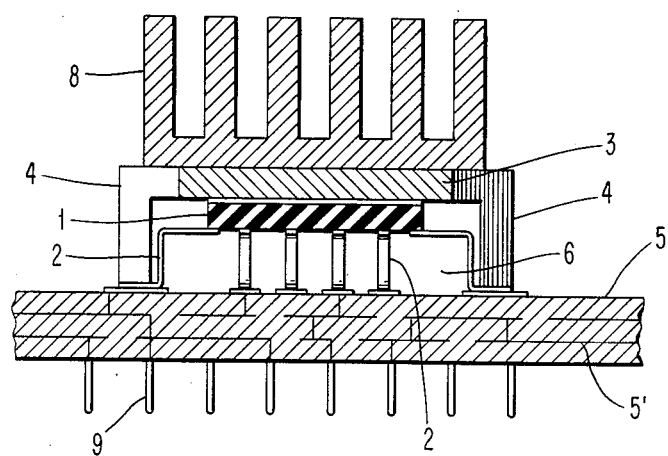
FIG. 3 is a sectional view along line A—A' of FIG. 2.

FIG. 1 is a perspective view, partly cut away, illustrating the entirety of the semiconductor module according to this embodiment. FIGS. 2 and 3 are a plan view and a sectional view respectively of the semiconductor module. As seen from FIGS. 1–3, the semiconductor module includes a semiconductor chip 1, lead wires 2 of the semiconductor chip 1 and a square cap 3. Leg or post members 4 are fixed on four corners of the cap 3. A multi-layer wiring substrate 5, is included having at least one insulating layer 5' formed with a non-organic insulating material. Lead terminals 7 are provided for contact with the lead wires 2, and a heat sink 8 is provided on the cap 3. The leg members 4 are securely erected on a surface of the multi-layer wiring substrate so as to define a space between the cap 3 and the surface of the multi-layer wiring substrate 5. A rectangular area formed on the multi-layer wiring substrate 5 by the four leg members 4 has sides thereof each of which is parallel to and longer than a corresponding side of the cap 3. The lead terminals are arranged between the sides of the cap and the corresponding sides of the rectangular or square area formed by the four leg members 4 when viewed from above the cap. The semiconductor chip 1 is attached on a surface of the cap 3 opposing the multi-layer wiring substrate 5 i.e. on the surface exposed to the space 6 of the cap 3. Respective lead wires 2 of the semiconductor chip 1 extend outwardly so that they can be easily confirmed visually from above the cap 3, and are bent downwardly at positions corresponding to the sides of the cap 3. In addition, the lead terminals 7 are connected to input-/output terminals 9 provided on the back surface of the substrate 5, respectively.

The assembling work for the semiconductor module shown is carried out as follows. At first, a die of the semiconductor chip 1, to which one terminal of each of the lead wires 2 is connected, is attached to the inner surface exposed to the space 6 of the cap 3 by bonding process etc. Thus, an assembly composed of the semiconductor chip 1, the lead wires 2, the cap 3 and the legs 4 is prepared. Next, the leg members 4 are fixed on the multi-layer substrate 5 by a bonding process. Then, the lead wires 2 of the semiconductor chip 1 are connected to the lead terminals 7 provided on the surface of the multi-layer wiring substrate 5 by presure-bonding or soldering process etc. Finally, the cooling heat sink 8 is provided on the cap 3. Instead of the cooling heat sink 8, a cooling heat sink (not shown) common to a plurality of caps may be provided over them. In the assembling work of the semiconductor module, the following advantages can be obtained. (1) It is possible to easily attach the die of the semiconductor chip 1 on the surface exposed to the space 6 of the cap 3 by bonding process etc. (2) It is also possible to easily fix the leg members 4 of the cap 3 on the multi-layer wiring substrate 5 by bonding process etc. in a manner similar to the above. (3) Since the lead wires 2 of the semiconductor chip 1 can be easily confirmed visually from above the cap 3, it is possible to easily connect these lead wires 2 to the respective lead terminals 7 of the multi-layer wiring substrate 5 by pressure-bonding or welding process. Accordingly, the assembling work is facilitated and the number of assembling steps is reduced.

In the above-mentioned embodiment, the multi-layer wiring substrate uses a non-organic material as the insulating material. In this case, since the lead terminal 7 is attached to the hard surface of the multi-layer wiring substrate, the pressure-bonding process can be easily performed. In addition, there may be employed a substrate which uses as the insulating material polyimide resin or a material obtained by adding fine powder of non-organic compound e.g. silica or alumina etc. into the polyimide resin.

While this invention has been illustrated and described in accordance with a preferred embodiment, it is recognized that variations and changes may be made and equivalents employed herein without departing from the invention as set forth in the claims.

What is claimed is:

1. A semiconductor module comprising:
   a multi-layer wiring substrate provided at a first surface with a plurality of input and output terminals and at a second surface with lead terminals which are connected to the input and output terminals;
   a rectangular cap and leg members provided on said second surface of said multi-layer wiring substrate, said leg members being fixed to four corners of said rectangular cap extending outwardly horizontally from a periphery of said cap and vertically downwardly to form between said multi-layer wiring substrate and said rectangular cap a space communicating with open air;
   a semiconductor chip fixed to a surface of said rectangular cap which is exposed to said space, said chip being supported by said rectangular cap; and
   lead wires each having two ends, one of which is connected to a terminal of said semiconductor chip, said lead wires extending outwardly horizontally beyond said semiconductor chip and from said periphery of said cap so that they can be visually confirmed from above said cap and bent vertically downwardly outside said periphery so that they can be visually confirmed from above said cap, and bent horizontally outwardly to permit the other end thereof to be electrically connected to said lead terminals.

2. A semiconductor module as set forth in claim 1, wherein said cap, said leg members, and said semiconductor chip constitute an assembly which is fixed to said multi-layer wiring substrate before said lead wires are connected with said lead terminals.

3. A semiconductor module as set forth in claim 1, wherein said leg members are fixed to corners of a rectangular area of said multi-layer wiring substrate, said rectangular area having sides parallel to and longer than the sides of said rectangular cap and said lead terminals are arranged between the sides of said rectangular cap and the corresponding sides of said rectangular area when viewed from above said rectangular cap.

4. A semiconductor module as set forth in claim 1, wherein a rectangular area is defined on said second surface of said multi-layer wiring substrate by points of attachment of said leg members to said second surface, said rectangular area having sides parallel to and longer than the sides of said rectangular cap.

5. A semiconductor module as set forth in claim 1, further comprising cooling means provided on said cap.

6. A semiconductor module as set forth in claim 1, wherein said multi-layer wiring substrate includes at least one insulating layer formed with a non-organic insulating material.

7. A semiconductor module as set forth in claim 1, wherein said multi-layer wiring substrate includes at least one insulating layer formed with polyimide resin.

8. A semiconductor module as set forth in claim 1, wherein said multi-layer wiring substrate includes at least one insulating layer formed by adding fine powder of a non-organic material into polyimide resin.

9. A semiconductor module as set forth in claim 8, wherein said non-organic material contains silica or alumina.

* * * * *